United States Patent

[11] 3,633,078

[72] Inventors Hans G. Dill
Costa Mesa;
Darrell M. Erb, Newport Beach; Thomas N. Toombs, Irvine, all of Calif.
[21] Appl. No. 869,151
[22] Filed Oct. 24, 1969
[45] Patented Jan. 4, 1972
[73] Assignee Hughes Aircraft Company
Culver City, Calif.

[54] STABLE N-CHANNEL TETRODE
4 Claims, 2 Drawing Figs.

[52] U.S. Cl. .......... 317/235 R, 317/146.5, 317/235, 317/235 B, 317/235 AG
[51] Int. Cl. .......... H01l 11/00, H01c 7/14
[50] Field of Search .......... 317/235 (21.1)

[56] References Cited

UNITED STATES PATENTS

| | | | |
|---|---|---|---|
| 3,475,234 | 10/1969 | Kerwin et al. | 317/235 |
| 3,500,142 | 3/1970 | Kahng | 317/235 |

FOREIGN PATENTS

| | | | |
|---|---|---|---|
| 1,535,286 | 6/1968 | France | 317/235 |
| 813,537 | 5/1969 | Canada | 317/235 |

*Primary Examiner*—Jerry D. Craig
*Attorneys*—James K. Haskell and William H. MacAllister, Jr.

ABSTRACT: A field-effect transistor having two overlapping insulated gates, the first gate being of silicon and extending only partially over the channel region between the source and drain with the second gate being superimposed over the first gate so as to cover the channel region at least where not covered by the first gate and being insulated from the first gate by silicon oxide formed from the first gate.

Figure 1:
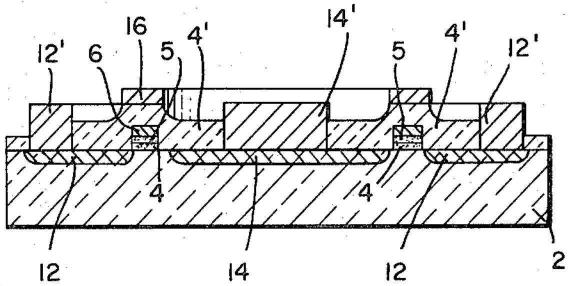

Hans G. Dill,
Darrell M. Erb,
Thomas N. Toombs,
INVENTORS.
BY.
W H [signature] Jr
ATTORNEY.

STABLE N-CHANNEL TETRODE

This invention relates to transistor devices especially of the type in which the conductivity of a region in a semiconductor body is modulated by means of an electric field. More particularly, the invention relates to transistor structures of the type known as insulated-gate field-effect transistors (IGFET).

In U.S. Pat. No. 3,454,844issued to H. G. Dill, one of the present inventors, an insulated-gate tetrode device is disclosed wherein many of the disadvantages of prior art field effect devices are overcome by means of two stacked overlapping gates, only one of which completely covers the channel region between the source and drain regions of the device.

The insulated-gate field-effect transistor of this patent, which is of the type to which the present invention apertains, comprises a body of semiconductive material having spaced regions of similar conductivity type exposed at a common surface of the semiconductor body. One of the spaced regions is normally referred to as the "source" since it is the region from which majority charge carriers flow through the solid semiconductor body to the other region which is usually referred to as the "drain" inasmuch as it is the region toward which the majority charge carriers flow or drain. The path between the source and drain regions through which the charge carriers flow is called the "channel." Control of the charge carriers flowing in the channel region is achieved by means of a "gate" usually disposed over the channel region and insulated from the semiconductor body so as to prevent the majority carriers from flowing to or from it. In this manner the gate electrode may not itself act as a source or drain electrode but may exert its control by the electric field effect in the channel region between the source and drain electrodes.

In order to avoid undue overlapping of the drain region by the gate (which results in the introduction of an undesirable feedback capacitance usually referred to as Miller feedback capacitance), an offset or half-gate arrangement is utilized. This half gate is disposed over a portion of the channel region between the source and the drain and is electrically insulated therefrom usually by an oxide such as silicon oxide formed from the semiconductor body itself. In general, this gate covers only the source side of the channel region and thus does not contribute to the aforementioned Miller feedback capacitance since it does not overlap the drain region. However, since it is desirable to achieve full channel control or modulation, a second gate is provided electrically insulated from the first gate and disposed so as to cover those portions of the channel region not covered by the half-gate although in some embodiments the uppermost gate may overlap the half-gate if desired.

As taught in the aforementioned U.S. patent, the second gate is electrically insulated from the first gate by means of an oxide, for example, pyrolytically deposited over the first gate and/or any other insulation already on the surface of the channel region. Electrical insulation between the two gates may be provided, for example, by the pyrolytic decomposition of a silane whereby a layer of silicon oxide is tenaciously deposited over the first gate which may be of metal. Heretofore such insulated-gate tetrode devices fabricated with an N-type channel have exhibited an undesirable irreversible electron trapping effect which causes the offset gate threshold voltage to increase during operation. It has been found that this trapping effect is a characteristic of the kind of insulation employed to insulate the two gates from each other and in particular the kind of insulation utilized to insulate the uppermost gate from the channel region. Particularly, it has been discovered that pyrolytically formed silicon oxide or nitride exhibits the aforementioned electron trapping effect, whereas silicon oxide formed by oxidizing silicon does not exhibit such effects.

It is therefore an object of the present invention to provide an improved field-effect device.

A further object of the invention is to provide an improved field-effect transistor having two insulated gates.

Still another object of the invention is to provide an improved field-effect transistor having two insulated gates and an N-channel region whereby the V-I characteristic of the device is stable with respect to changes in the applied gate voltage.

These and other objects and advantages of the invention are realized in a typical embodiment comprising an insulated-gate tetrode transistor structure having an offset gate formed of silicon which is electrically insulated from the second gate by an oxide formed from the silicon offset gate, the second gate being superimposed at least in part over the offset gate and extending at least over portions of the channel region not covered by the offset gate. The same kind of oxide, that is silicon oxide, also is provided in contact with the surface of the channel region between the offset gate and the drain region of the device. Thus, the use of a semiconductor gate member which may be of the same kind of semiconductor material as the device body permits the utilization of high temperatures to rapidly and therefore economically form a dielectric layer characterized by having a low-electron trap density. While the invention is taught as utilizing a gate of semiconductor material for this purpose, it is not necessarily restricted thereto, providing an insulation material is employed which exhibits the low-electron trap density. It is, however, of particular advantage to employ silicon as the gate electrode since it may be readily converted to an oxide which does exhibit such low electron trap density. The phase "low-electron trap density" means that the density of traps available to trap electrons is not large enough to have an effect on the electron potential at the oxide-silicon (channel) interface compared to the effect of the offset gate voltage.

Figure 2:
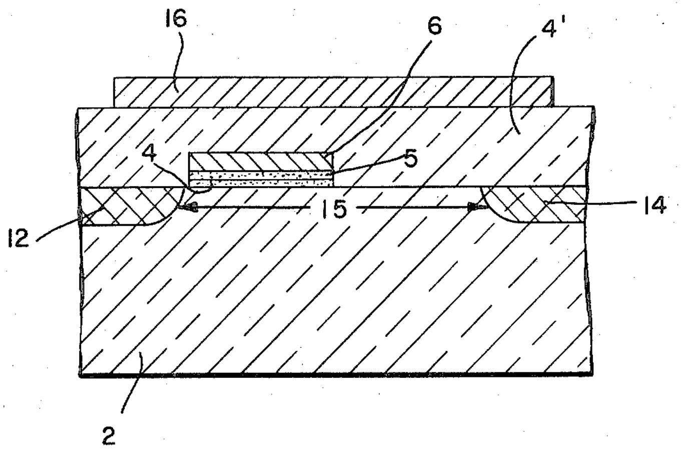

The invention will be described in greater detail by reference to the drawings in which:

FIG. 1 is a cross-sectional view in elevation of an insulated-gate tetrode transistor device according to the present invention; and FIG. 2 is an enlarged cross-sectional view in elevation of the tetrode transistor device shown in FIG. 1.

Referring now to the drawings, the fabrication of a field effect tetrode transistor device according to the invention will be described. The present invention is concerned primarily with the gate electrode arrangement and the fabrication arrangement and the fabrication thereof. However, in the following paragraphs the steps necessary to form the source and drain regions, the gate structure, the insulation for the gate, and the necessary electrical contacts to the source, drain, and gate will be explained. It should also be understood that, while the fabrication of a single device is described, in practice a large number of identical devices on a common semiconductor body may be formed simultaneously and subsequently separated therefrom to yield discrete devices. Finally, while an embodiment is shown and described wherein the uppermost gate completely covers the channel region (and hence completely overlaps the offset gate), there are also embodiments wherein the present invention has utility notwithstanding the fact that the uppermost gate only covers portions of the channel region not covered by the offset gate or wherein the uppermost gate only overlaps the offset gate in part.

In the drawings a semiconductor body 2 is shown which may be of P-type silicon, for example, having a typical resistivity of about 10ohm-centimeters. A surface of the semiconductor body 2 is provided initially with an overall masking layer. A suitable material for this purpose is silicon dioxide which may be formed by heating the silicon semiconductor body 2 in an oxidizing atmosphere. Typically, such an insulating layer may be provided by heating the silicon body 2 to about 1150° C. in steam until a layer of silicon dioxide about 0.5 micron thick, for example, is obtained.

The next step is to form the source and drain regions 12 and 14 as by diffusing an N-type impurity into the silicon body 2 from the exposed surfaces of the body. Such diffusion processing is well known in the art and need not be extensively described herein. This step is accomplished by providing openings as by well-known photoresist masking and etching procedures through selected portions of the masking layer.

Thereafter the portions of a silicon body which are exposed to the ambient through the openings in the masking layer are converted to N-type conductivity by diffusing an N-type impurity such as phosphorus or arsenic, for example, into the exposed portions of the semiconductor body. Atoms of the impurity penetrate the silicon body at the exposed surfaces thereof and convert the conductivity type of these surface and near-surface portions to N-type while leaving the masked portions of the silicon body unaffected. Thus, N-type source and drain regions 12 and 14 are formed in the silicon body 2 and separated from each other by a P-type region 15 which remains after the diffusion operation and unaffected thereby. It will be understood that while the region 15 is of P-type conductivity, the channel in this P-type region will be N-type and is formed by field inversion as is well understood in the art.

At some point near or at the end of the diffusion of the source and drain regions oxygen may be introduced into the system so as to form a thin layer of silicon oxide over the source and drain regions. Thereafter by photoresist masking and etching techniques the oxide disposed on the source and drain and/or other desired surfaces of the semiconductor body are protected by photoresist films while the oxide over the channel region is removed. Thereafter a new layer 4 of thermally grown silicon oxide is provided over the channel region as by again exposing the surface of the silicon body to an oxidizing atmosphere at an elevating temperature. This layer of silicon oxide may be about 0.1 micron thick.

Because of the extreme thinness of the oxide layer 4 which might permit penetration or diffusion therethrough of impurities in the gate member to be subsequently formed, it may be desirable to form a layer 5 of silicon nitride over the channel oxide layer 4. The layer 5 of silicon nitride may be about 200 A. thick and may be formed by the pyrolytic decomposition and deposition of silane and ammonia. It should be understood that this nitride layer 5 is a preferred but not essential feature.

Thereafter, by pyrolysis of a silicon compound or by electron beam evaporating or by sputtering silicon, a layer 6 of silicon is formed over the oxide layer 4. Typically, the silicon layer 6 may be deposited to a thickness of about 10,000 A. To deposit the silicon layer by pyrolysis, the silicon substrate 2 is heated to about 800° C. and exposed to an atmosphere containing the gas $SiH_4$ which decomposes and forms the layer 6 of silicon over the oxide lay 4. Since the silicon layer 6 is formed on an alien material (that is, material other than single crystalline silicon) or oxide, the layer 6 will probably be polycrystalline. For the purposes of the invention, the crystalline form of the silicon layer 6 is not important and may be either single or polycrystalline.

Since it is desirable to apply potentials to the offset gate member 6 for the purpose of establishing the desired electric field or fields in the channel region 15, it is usually desirable to "dope" the silicon gate member 6 with a conductivity-type-determining impurity such as boron, for example. This doping (or introduction into the structure of the silicon gate member 6 of such an impurity) may be carried out to such an extent that the silicon gate member exhibits properties more akin to those of a conductor of electricity than a nonconductor. Such extensive doping to achieve the conversion from a semiconductor to a conductor member is well known in the art and is referred to as degenerative doping.

The next step is to form an offset gate structure from the silicon layer 6 just deposited. Under some circumstances it might be possible to proceed to form the gate by masking the desired portion of the silicon layer 6 with a suitable photoresist which is a material capable of being selectively insensitized to chemical attack by exposure to a prescribed light pattern and thereafter removed when and as desired. However, it has been found difficult to selectively and satisfactorily etch silicon with most photoresist materials. Hence, it is preferable to form an intermediate mask against etching in order to satisfactorily etch away the silicon layer 6 except where desired. This may be accomplished by forming an intermediate masking layer of silicon dioxide over the silicon layer 6 and then by means of conventional photoresist techniques forming a mask from the silicon dioxide layer. Thereafter, by sensitizing the photoresist material by light and removing the sensitized portions thereof, all of the silicon dioxide layer may be exposed except where desired. The exposed portions of the silicon dioxide layer are then removed by etching against which the photoresist mask protects the underlying silicon dioxide. The result is the formation of a mask of silicon dioxide from which the photoresist material is subsequently removed. In the foregoing description, it will be understood that the second or intermediate masking layer of silicon dioxide may be formed exactly as was the first layer 4 of silicon dioxide. In addition, it is also possible to form the intermediate masking layer of materials other than silicon dioxide.

Thereafter, using the intermediate masking layer of silicon dioxide as a mask, the exposed portions of the silicon layer 6 are removed leaving a gate member 6 of silicon positioned on the semiconductor body 2 and electrically insulated therefrom by the silicon dioxide layer 4 and the silicon nitride layer 5, if employed. A more detailed description of the processing steps to form the silicon gate 6 may be found in the copending application of H. G. Dill, one of the present inventors Ser. No. 589,547 filed Oct. 26, 1966, now U.S. Pat. No. 3,544,399 and assigned to the instant assignee. This gate member 6 may be referred to as a half-gate or an offset gate since it does not extend completely over the channel region 15 but only about half way from the source region 12 to a point about midway of the channel region. Because the gate 6 is offset toward the source region 12, it is referred to hereinafter as the offset gate.

After formation of the source and drain regions 12 and 14 and the offset gate member 6, as just described, additional electrical insulation to isolate the offset gate member 6 from the second gate member yet to be formed is provided by means of an additional layer of silicon oxide 4'. The layer 4' of silicon oxide is formed from the silicon comprising the semiconductor body 2 and the silicon gate member 6. Preliminary to forming the layer 4' of silicon oxide, all of the oxide and nitride (if used) is removed as by etching from all surfaces of the device except where protected by the silicon gate 6. The oxide layer 4' may be provided by heating the silicon body to a temperature of about 1150° C. in steam, for example, to grow a relatively thick dielectric layer of about 10,000 A. in thickness. This oxide layer 40' will thus cover the channel, source and drain regions as well as the silicon offset gate member 6.

By means of a mask plate or other suitable techniques such as photoresist and etching, the gate member 6 and the source and drain regions 12 and 14 may be provided with electrical contacts thereto by exposing selected portions of these regions and then vapor depositing or otherwise forming an electrically conductive material or metal in or over such exposed portions thereof. The exposed portion of the offset gate 6 may be in the form of a tab or extension not covered by the aforementioned oxide layers, if desired. Thus the source and drain regions 12 and 14 are provided with electrical contacts 12' and 14', respectively. These contacts may be formed by vapor depositing a film of metal such as aluminum, chromium, or gold to a thickness of about 1,000 to 4,000 A. over the respective exposed surfaces. The contact to the gate member 6 is not shown in the drawings since this contact extends in a direction at right angles to plane of the drawing. The electrical connections thus made by means of these contact members are all provided on the same surface of the device.

A second gate 16 is provided on the insulation layer 4'. As shown this gate completely covers the underlying channel region 15 and thus overlaps the offset gate member 6. However, in some embodiments the second gate 16 need only extend over those portions of the channel region 15 not covered by the gate member 6. This second gate may be provided by vapor depositing a layer of metal such as aluminum over the entire surface of the oxide layer 4' to a thickness of about 4,000 A. By resist masking and etch procedures portions of this metal layer may then be removed so as to leave a metal gate 16 disposed over the offset gate member 6 and completely, covering the channel region 15, the gate 16 being electrically insulated from the offset gate 6 by the relatively thick layer 4' of thermal oxide.

The oxide constituting the insulation layer 4', having been grown thermally (that is, having been grown by heating the silicon gate member in an oxidizing atmosphere), has a very low-electron trap density so that electrons are not trapped therein but may pass directly to the gate electrode 16. In the absence of electron trapping in this oxide layer, the drain current is dependent only on the voltage of the offset gate member 6. However, if electrons are trapped within the insulation layer 4', the trapped charge tends to counteract the field produced by the offset gate member 6. Under these circumstances if the voltage on the offset gate member 6 is decreased, the field at the interface between the silicon body and the silicon oxide layer in the region of the offset gate member 6 is inadequate to cause depletion or inversion and the drain current decreases drastically. For example, in the case of an N-channel insulated-gate tetrode where the gate insulation was provided by thermal silicon oxide, silicon nitride, pyrolytic silicon oxide (in order of deposition or formation), the drain current at a drain voltage of 180 v. decreased 5.4 to 3.6 ma. when the offset gate voltage was decreased from 200 to 192 v. A further decrease to 184 v. resulted in zero drain current. However, with an N-channel IGFET fabricated according to the present invention, no appreciable decrease in the drain current was observed until the offset gate voltage was reduced below about 30v.

There thus has been described a novel N-channel insulated-gate field-effect transistor device having a high drain breakdown potential which makes it especially useful as a power amplifier and as a driver for plasma lamps. By utilizing a dielectric of low-trap density between the offset gate and the drain according to the present invention, N-channel tetrodes have been fabricated exhibiting stable offset gate threshold voltages and drain breakdown voltages of over 250v.

What is claimed is:

1. A field-effect transistor device comprising:
a. a silicon body of a first conductivity type;
b. spaced source and drain regions of opposite conductivity type disposed in said silicon body and at a common surface thereof;
c. a channel region disposed in said silicon body between said source and drain regions;
d. a first gate electrode extending from said source region partially over and electrically insulated from said channel region toward said drain region but stopping short thereof;
e. a second gate electrode extending at least over the portions of said channel region not covered by said first gate electrode, overlapping at least part of said first gate electrode and electrically insulated from said channel and said first gate electrode by a layer of electrically insulating material;
f. the portion of said electrically insulating material between said channel and said second gate electrode being a low-electron trap density layer formed from said silicon body and being contiguous with said second gate electrode and said silicon body.

2. A field-effect transistor device comprising;
a. a silicon body of a first conductivity type;
b. spaced source and drain regions of opposite conductivity type disposed in said silicon body and at a common surface thereof;
c. a channel region disposed in said silicon body between said source and drain regions;
d. a gate electrode of silicon extending from said source region partially over and electrically insulated from said channel region toward said drain region but stopping short thereof;
e. a second gate electrode extending at least over the portions of said channel region not covered by said silicon gate electrode, overlapping at least part of said gate, and electrically insulated from said channel and said silicon gate electrode by a layer of silicon oxide;
f. the portion of said layer of silicon oxide between said channel and said second gate electrode being a low-electron trap density layer formed from said silicon body and being contiguous with said second gate electrode.

3. A field-effect transistor device comprising;
a. a silicon body of a first conductivity type;
b. spaced source and drain regions of opposite conductivity type disposed in said silicon body and at a common surface thereof;
c. a channel region disposed in said silicon body between said source and drain regions;
d. a gate electrode of silicon extending from said source region partially over said channel region toward said drain region but stopping short thereof;
e. a thin film of silicon oxide formed from said silicon body disposed between said silicon gate electrode and said channel region;
f. a second gate electrode extending at least over the portions of said channel region not covered by said silicon gate electrode, overlapping at least part of said gate electrode, and electrically insulated from said channel and said silicon gate electrode by a layer of silicon oxide;
g. the portion of said layer of silicon oxide between said channel and said second gate electrode being a low-electron trap density layer formed from said silicon body and being contiguous with said second gate electrode.

4. A field effect transistor device comprising;
a. a silicon body of a first conductivity type;
b. spaced source and drain regions of opposite conductivity type disposed in said silicon body and at a common surface thereof;
c. a channel region disposed in said silicon body between said source and drain regions;
d. a gate electrode of silicon extending from said source region partially over said channel region toward said drain region but stopping short thereof;
e. a thin film of silicon oxide formed from said silicon body disposed between said silicon gate electrode and said channel region;
f. a thin film of silicon nitride disposed between said silicon gate and said thin film of silicon oxide;
g. a second gate electrode extending at least over the portions of said channel region not covered by said silicon gate electrode, overlapping at least part of said gate electrode, and electrically insulated from said channel and said silicon gate electrode by a layer of silicon oxide;
h. the portion of said layer of silicon oxide between said channel and said second gate electrode being a low-electron trap density layer formed from said silicon body and being contiguous with said second gate electrode.

* * * * *